(12) United States Patent
Leussler et al.

(10) Patent No.: US 11,181,600 B2
(45) Date of Patent: Nov. 23, 2021

(54) MAGNETIC RESONANCE IMAGING SYSTEM WITH RF MOTION DETECTION

(71) Applicant: KONINKLIJKE PHILIPS N.V., Eindhoven (NL)

(72) Inventors: Christoph Leussler, Hamburg (DE); Daniel Wirtz, Hamburg (DE); Tim Nielsen, Hamburg (DE)

(73) Assignee: Koninklijke Philips N.V., Eindhoven (NL)

( * ) Notice: Subject to any disclaimer, the term of this patent is extended or adjusted under 35 U.S.C. 154(b) by 0 days.

(21) Appl. No.: 16/763,589

(22) PCT Filed: Nov. 9, 2018

(86) PCT No.: PCT/EP2018/080825
§ 371 (c)(1),
(2) Date: May 13, 2020

(87) PCT Pub. No.: WO2019/096707
PCT Pub. Date: May 23, 2019

(65) Prior Publication Data
US 2020/0284863 A1    Sep. 10, 2020

(30) Foreign Application Priority Data

Nov. 16, 2017   (EP) ................................ 17202078

(51) Int. Cl.
*G01R 33/567* (2006.01)
*G01R 33/34* (2006.01)
(Continued)

(52) U.S. Cl.
CPC ... *G01R 33/5673* (2013.01); *G01R 33/34007* (2013.01); *G01R 33/3692* (2013.01); *G01R 33/56509* (2013.01)

(58) Field of Classification Search
CPC .......... G01R 33/5673; G01R 33/34007; G01R 33/3692; G01R 33/56509
See application file for complete search history.

(56) References Cited

U.S. PATENT DOCUMENTS 4,712,560 A    12/1987  Schaefer et al.
2012/0095322 A1  4/2012  Tsekos et al.
(Continued)

FOREIGN PATENT DOCUMENTS

JP   02180404 A    7/1990
KR   101688434 B1  12/2016

OTHER PUBLICATIONS

English translation of KR-10-1688434 (Year: 2016).*
Bartula, et al., "Camera-based System for Contactless Monitoring of Respiration" Proc. IEEE EMBS, pp. 2672, 2014.
Erhan, D., Courville, A., Bengio, Y., Vincent, P.: "Why Does Unsupervised Pre-training Help Deep Learning".J.Mach. Learn. Res. 11(3), 625-660 (2010).
(Continued)

*Primary Examiner* — G.M. A Hyder (57) ABSTRACT

The present invention is directed to a magnetic resonance imaging system with motion detection for examination of a patient (53), the magnetic resonance imaging system comprising an RF coil arrangement with an RF coil (4) for transmitting and/or receiving an RF signal for generating a magnetic resonance image wherein the RF coil arrangement is provided with an additional RF sensor (5) for transmitting an RF transmit signal which is adapted for interacting with the tissue (23) of the patient (53) allowing to sense motion signals due to motions of the patient (53) simultaneously to transmitting and/or receiving the RF signal for generating the magnetic resonance image. In this way movements of a patient under examination in an MRI system may be detected in an efficient and reliable way.

14 Claims, 4 Drawing Sheets

(51) Int. Cl.
  *G01R 33/36*     (2006.01)
  *G01R 33/565*    (2006.01)

(56) References Cited

U.S. PATENT DOCUMENTS

| | | | |
|---|---|---|---|
| 2014/0073908 A1 | 3/2014 | Biber | |
| 2014/0139218 A1* | 5/2014 | Findeklee | |
| 2015/0002331 A1* | 1/2015 | Allmendinger | A61B 5/113 342/175 |
| 2015/0293201 A1* | 10/2015 | Assmann | G01R 33/28 324/318 |
| 2015/0320342 A1* | 11/2015 | Biber | G01R 33/36 600/411 |
| 2016/0033591 A1 | 2/2016 | Leussler et al. | |
| 2017/0160367 A1 | 6/2017 | Schroter et al. | |
| 2020/0110145 A1* | 4/2020 | Zeller | A61B 5/113 |

OTHER PUBLICATIONS

Jin et al "Modeling of nonlinear system based on deep learning framework" Nonlinear Dynamics 2015.
J. Enriquez, "DARPA Launches Artificial Intelligence Program to Monitor Radio Signals" The Radio Frequency Spectrum + Machine Learning=A New Wave in Radio Technology, Aug. 2017.
Buikman et al, The RF Coil as a Sensitive Motion Detector for Magnetic Resonance Imaging, vol. 6, pp. 281-289, 1988.
Schroder et al "A Novel Method for Contact-Free Cardiac Synchronization Using the Pilot Tone Navigator",Proc. Intl. Soc. Mag. Reson. Med. 24 (2016) 0410.
International Search Report from PCT/EP2018/080825 dated Apr. 10, 2019.
Storey et al "Band Artifacts due to Bulk Motion" Magnetic Resonance in Med. 48 p. 1028-1036 (2002).

* cited by examiner

MAGNETIC RESONANCE IMAGING SYSTEM WITH RF MOTION DETECTION

CROSS REFERENCE TO RELATED APPLICATIONS

This application is a U.S. national phase application of International Application No. PCT/EP2018/080825 filed on Nov. 9, 2018, which claims the benefit of EP Application Serial No. 17202078.6 filed on Nov. 16, 2017 and is incorporated herein by reference.

FIELD OF THE INVENTION

The invention relates to a magnetic resonance imaging (MRI) system for MRI examination of a patient, the magnetic resonance imaging system comprising an RF coil arrangement with an RF coil for transmitting and/or receiving an RF signal for generating a magnetic resonance image, and especially to a magnetic resonance imaging system with the possibility to detect motions of the patient under examination.

BACKGROUND OF THE INVENTION

As is generally known in the art, in a magnetic resonance imaging system, a patient, usually a human being or an animal, is exposed to a uniform main magnetic field (B0 field) so that the magnetic moments of the nuclei within the patient form a certain net magnetization of all nuclei parallel to the B0 field, which can be tilted leading to a rotation around the axis of the applied B0 field (Larmor precession). The rate of precession is called Larmor frequency which is dependent on the specific physical characteristics of the involved nuclei, namely their gyromagnetic ratio, and the strength of the applied B0 field. The gyromagnetic ratio is the ratio between the magnetic moment and the spin of a nucleus.

By transmitting an RF excitation pulse (B1 field) which has an orthogonal polarization to the B0 field, generated by means of an RF transmitting antenna or coil, and matching the Larmor frequency of the nuclei of interest, the spins of the nuclei can be excited and brought into phase, and a deflection of their net magnetization from the direction of the B0 field is obtained, so that a transversal component in relation to the longitudinal component of the net magnetization is generated.

After termination of the RF excitation pulse, the relaxation processes of the longitudinal and transversal components of the net magnetization begin, until the net magnetization has returned to its equilibrium state. MR (magnetic resonance) signals which are generated by the processing magnetization, are detected by means of an RF receiving antenna or coil. The received MR signals which are time-based amplitude signals, are then Fourier transformed to frequency-based MR spectrum signals and processed for generating a MR image of the nuclei of interest within the patient.

In order to obtain a spatial selection of a slice or volume within the patient and a spatial encoding of the received MR signals emanating from a slice or volume of interest, gradient magnetic fields are superimposed on the B0 field, having the same direction as the B0 field, but having gradients in the orthogonal x-, y- and z-directions. Due to the fact that the Larmor frequency is dependent on the strength of the magnetic field which is imposed on the nuclei, the Larmor frequency of the nuclei accordingly decreases along and with the decreasing gradient (and vice versa) of the total, superimposed B0 field, so that by appropriately tuning the frequency of the transmitted RF excitation pulse (and by accordingly tuning the resonance frequency of the RF/MR receive antenna), and by accordingly controlling the gradient magnetic fields, a selection of nuclei within a slice at a certain location along each gradient in the x-, y- and z-direction, and by this, in total, within a certain voxel of the object can be obtained.

The above described RF (transmitting and/or receiving) antennas can be provided in the form of coils which can be fixedly mounted within an examination space of an MRI system for imaging a whole patient, or which are arranged directly on or around a local zone or area to be examined.

MRI scans need a number of input parameters and proper scan preparation. Depending on body size and body weight of a patient under examination, patient position and anatomy to be scanned, typically a protocol is chosen and modified to fit the patient. Usually, this data has to be entered manually. Physiology parameters, e.g. necessary for triggering scans, have to be measured using dedicated sensors. However, during a MRI procedure the patient is covered by clothes and for the most applications covered by RF coils such as head and/or (anterior) surface coils. Therefore, optical detection methods for detecting motions of the patient are difficult to realize.

In this regard, from U.S. Pat. No. 4,712,560 an apparatus and a method are known which provide signals corresponding to physiological motion of an imaging slice in an MRI system for use in synchronizing acquisition of MRI data with movement of the slice. The signals are generated by initiating an incident signal of a predetermined frequency which interacts with the imaging slice and returns a reflected signal of this frequency. By mixing the incident and reflected signal, a baseband signal is generated which is indicative of changes in the phase and magnitude relationships between the signals. Because changes in the phase and magnitude relationships between the signals are related in an approximately linear manner to movement of the imaging slice, the baseband signal provides an indication of movement of the imaging slice to serve as an accurate triggering signal to synchronize acquistion of MRI data with movement of the imaging slice.

Such movement information is used for motion correction and cardiac triggering, but also for estimating a rough patient model, which can be calculated in real time. Further application is for triggering therapy devices (e.g. MR-LINAC).

SUMMARY OF THE INVENTION

It is an object of the invention to provide an alternative solution for detecting movements of a patient under examination in a MRI system in an efficient and reliable way.

According to the invention, this object is addressed by the subject matter of the independent claims. Preferred embodiments of the invention are described in the sub claims.

Therefore, according to the invention, a magnetic resonance imaging system for examination of a patient is provided, the magnetic resonance imaging system comprising an RF coil arrangement with an RF coil for transmitting and/or receiving an RF signal for generating a magnetic resonance image wherein the RF coil arrangement is provided with an additional RF sensor for transmitting an RF transmit signal which is adapted for interacting with the tissue of the patient allowing to sense motion signals due to motions of the patient simultaneously to transmitting and/or receiving the RF signal for generating the magnetic resonance image.

Thus, the present invention relates to realizing a MRI system with an additional RF sensor to monitor motion signals like breathing and cardiac signals. The term "additional" relates to the fact that the additional sensor is provided in addition to the RF coil which may already be used as a sensor for such motion signals. Therefore, it is an essential feature of the invention, that further to the RF coil an additional sensor is provided for transmitting an RF transmit signal which is adapted for interacting with the tissue of the patient allowing to sense motion signals due to motions of the patient simultaneously to transmitting and/or receiving the RF signal for generating the magnetic resonance image. Clinical applications may use this additional information for simultaneous measurement and estimation of permittivity or conductivity (e.g. input for electrical properties tomography), real time electrical patient modelling and specific absorption rate control, motion correction/modelling and cardiac triggering. These applications as such are well known to the man skilled in the art and, thus, here a detailed explanation is omitted for the sake of clarity.

Such RF monitoring has several advantages over other ways to monitor the patient: In contrast to optical monitoring, RF penetrates into the patient's body through clothing or other material covering the patient. In contrast to MR navigators, it can be operated simultaneously with the MR imaging. Thus sensor data are available continuously throughout the entire examination procedure independent of the sequence that is run on the system. It is contactless, i.e. no devices have to be attached to the patient by the MR operator, making it no burden on the workflow.

Typically, in the MRI context it is e.g. the breathing or cardiac motion that is of most interest with respect to motions of the patient. Therefore, the term "motions of the patient" does not only cover motions of the patient which are visible from outside but also motions within the patient like motions of internal organs of the patient. In most exams, the patient lies perfectly still but tracking the internal sources of motion is relevant for high quality imaging.

In general, such motion signals may be received by the RF coil itself. However, according to a preferred embodiment of the invention, the additional RF sensor is also configured for receiving the motion signals which are due to motions of the patient.

Further, according to a preferred embodiment of the invention, the RF coil arrangement is equipped with a preamplifier, and the additional RF sensor is arranged in the preamplifier. In this respect, it is further preferred that the additional RF sensor comprises an antenna which is located on a printed circuit board of the preamplifier. Alternatively, according to a preferred embodiment of the invention, the additional RF sensor comprises an antenna which is integrated into the RF coil.

The additional RF sensor may be used for transmitting different types of signals. According to a preferred embodiment of the invention, the additional RF sensor is configured for transmitting continuous-wave radar signals and/or ultra wideband radar signals.

According to a preferred embodiment of the invention, the magnetic resonance imaging system further comprises a machine-learning module with deep learning capability adapted for receiving the sensed motion signals. Deep learning methods aim at learning feature hierarchies with features from the higher levels of the hierarchy formed by the composition of lower level features. They may include learning methods for a wide array of deep architectures, including neural networks with hidden layers and graphical models with levels of hidden variables. Unsupervised pre-training works to render learning deep architectures more effective. Unsupervised pre-training acts as a kind of network pre-conditioner, putting the parameter values in the appropriate range for further supervised training and initializes the model to a point in parameter space that somehow renders the optimization process more effective, in the sense of achieving a lower minimum of the empirical cost function.

In this respect it is to be noted that using a machine-learning module with deep learning capability for the MRI system is not restricted to such additional RF sensors which are part of the RF coil arrangement which also comprises the RF coil for transmitting and/or receiving the RF signal for generating a magnetic resonance image. In contrast to that, the additional RF sensor may be provided independently from the RF coil. In this respect, according to a preferred embodiment of the invention, the additional RF sensor is arranged in a patient bed which is adapted for holding the patient during examination. Preferably, multiple such RF sensors are provided.

According to a preferred embodiment of the invention, the machine-learning module is also connected to the RF coil for receiving the RF signals for generating the magnetic resonance image. Furthermore, it is preferred that multiple RF coil arrangements and multiple machine-learning modules are provided, each RF coil arrangement comprising an RF coil for transmitting and/or receiving an RF signal for generating a magnetic resonance image and an additional RF sensor for transmitting an RF transmit signal which is adapted for interacting with the tissue of the patient allowing to sense motion signals of the patient, wherein each RF coil arrangement is connected to a separate machine-learning module for transmitting the respective sensed motion signals and the respective signals for generating the magnetic resonance image to the respective machine-learning module.

The invention also relates to a method of operating a magnetic resonance imaging system for examination of a patient, the magnetic resonance imaging system comprising an RF coil arrangement with an RF coil and an additional RF sensor, the method comprising the following steps:

transmitting and/or receiving an RF signal for generating a magnetic resonance image by the RF coil, and transmitting an RF transmit signal which is adapted for interacting with the tissue of the patient by the additional RF sensor allowing to sense motion signals due to motions of the patient simultaneously to transmitting and/or receiving the RF signal for generating the magnetic resonance image.

Preferred embodiments of this method relate to the preferred embodiments of the MRI system described further above.

Further, the invention also relates to a non-transitory computer-readable medium for controlling the operation of a magnetic resonance imaging system for examination of a patient, the magnetic resonance imaging system comprising an RF coil arrangement with an RF coil and an additional RF sensor, the non-transitory computer-readable medium comprising instructions stored thereon, that when executed on a processor, perform the steps of any of the methods described herein.

BRIEF DESCRIPTION OF THE DRAWINGS

These and other aspects of the invention will be apparent from and elucidated with reference to the embodiments described hereinafter. Such an embodiment does not necessarily represent the full scope of the invention, however, and reference is made therefore to the claims and herein for interpreting the scope of the invention.

In the drawings.

DETAILED DESCRIPTION OF EMBODIMENTS

Figure 1:
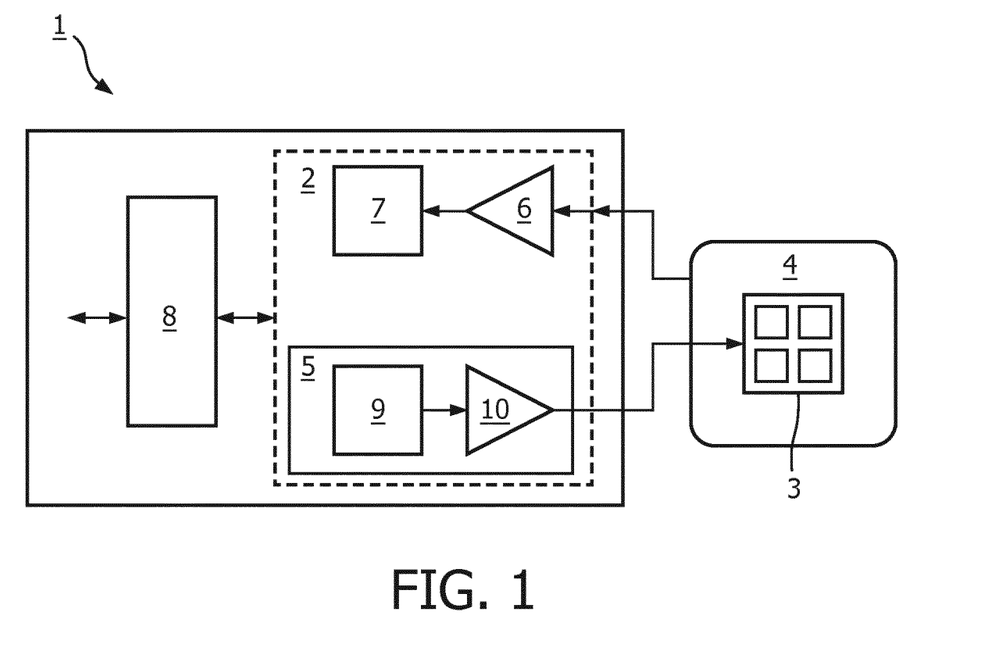
FIG. 1 schematically depicts a preamplifier printed circuit board with an integrated RF transceiver device for motion detection according to a preferred embodiment of the invention, FIG. 2 schematically depicts a preamplifier printed circuit board with an integrated RF transceiver device for motion detection according to another preferred embodiment of the invention, FIG. 3 schematically depicts an RF coil array with integrated RF motion detectors according to a preferred embodiment of the invention, FIG. 4 schematically depicts RF coils with integrated RF motion detector antennas according to further preferred embodiments of the invention, FIG. 5 schematically depicts an RF coil antenna with integrated distributed stub antennas according to a preferred embodiment of the invention, and FIG. 6 schematically depicts a MRI system with multiple RF sensors in a patient bed according to a preferred embodiment of the invention.

From FIG. 1 schematically a preamplifier printed circuit board 1 with an integrated RF transceiver device 2 for motion detection and an RF coil 4 according to a preferred embodiment of the invention can be seen. This is an RF coil arrangement with an RF coil 4 for transmitting and/or receiving an RF signal for generating a magnetic resonance image wherein the RF coil arrangement is provided with an additional RF sensor for transmitting and receiving an RF transmit signal which is adapted for interacting with the tissue of a patient under examination allowing to sense motion signals due to motions of the patient simultaneously to transmitting and/or receiving the RF signal for generating the magnetic resonance image. The antenna 3 of the RF transceiver 2 is integrated in the RF coil 4 but may also be located on the printed circuit board 1. The RF coil 4 itself may also be used as antenna device by the RF transceiver device 2 in a multi resonant design. The printed circuit board 1 comprises a radar and RF sensor 5 including a digital modulator 9 and an amplifier 10 from where signals are fed to the antenna 3. Signals received by the RF coil 4 are fed to the preamplifier 6 and further to the digitizer and compressor 7. I/O functionality is realized by a digital interface 8.

Figure 2:
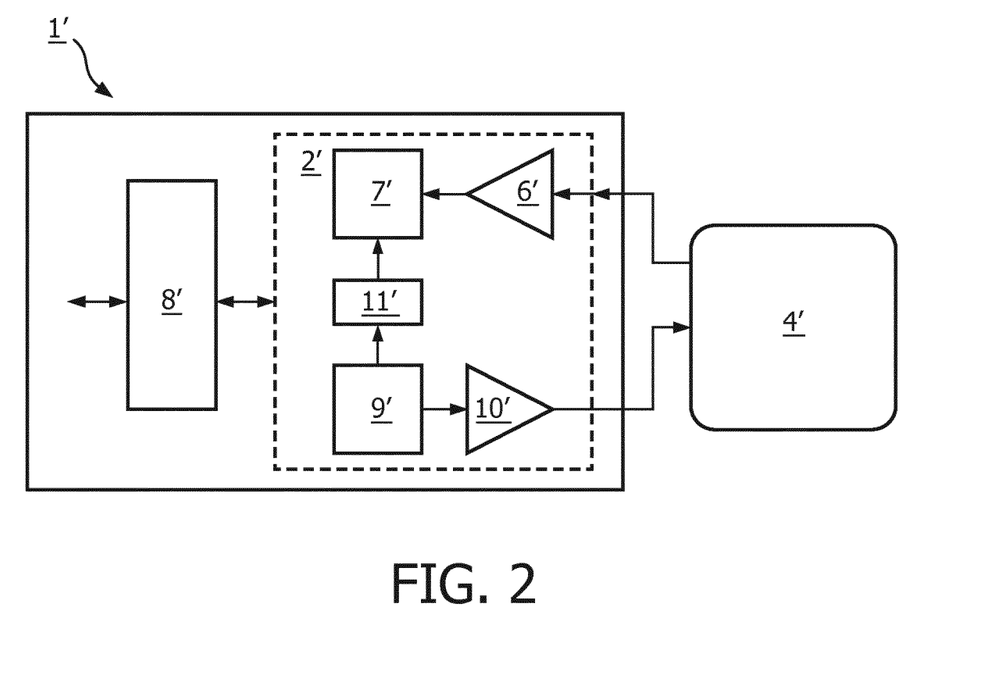

FIG. 2 schematically depicts a preamplifier printed circuit board with an integrated RF transceiver device 2' for motion detection according to another preferred embodiment of the invention. The general design is similar to the design shown in FIG. 1 and like devices are referred to with like reference signs. However, here, a carrier signal is generated which is either outside the MRI band or is a digital spread spectrum signal. The spread spectrum signal is removed from the MRI signal via decorrelator 11. The RF coil 4 is simultaneously used for MRI and the additional RF signal for motion detection.

Figure 3:
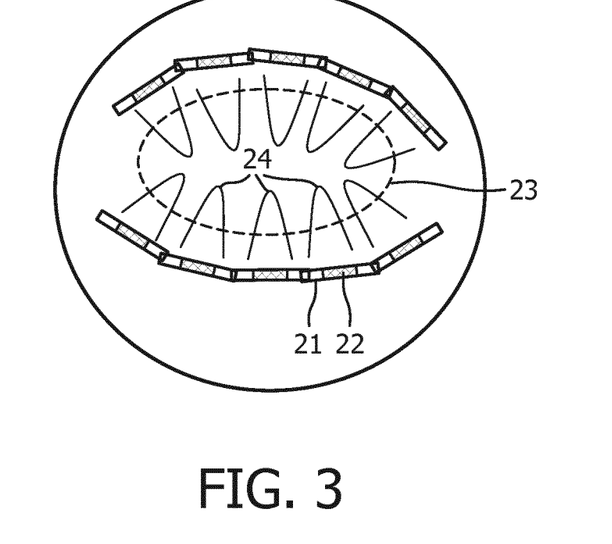

An RF coil array with integrated RF motion detectors according to a preferred embodiment of the invention is schematically depicted in FIG. 3. Each individual coil 21 is equipped with a local motion detector device 22. The motion detector device 22 senses the motion in the tissue 23 of the patient, i.e. the motion of internal organs of the patient (heart, liver) or the body surface of the patient. The motion sensing field is referred to by reference sign 24. Either reflected wave or crosstalk between individual coil elements is used for further processing.

Figure 4A:
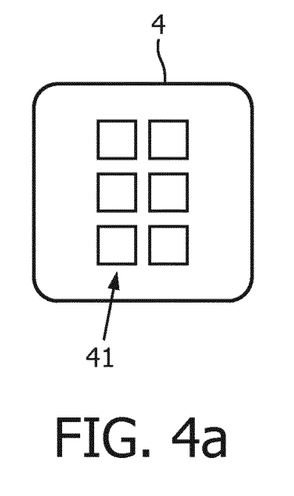
Figure 4B:
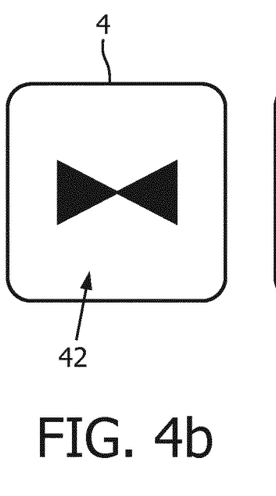
Figure 4C:
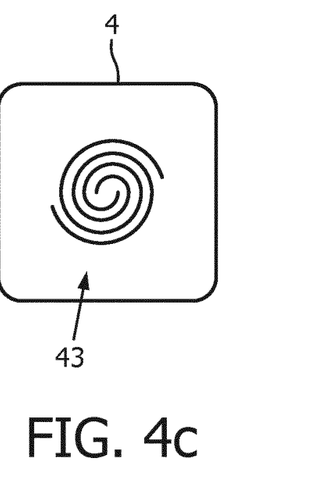
Figure 5:
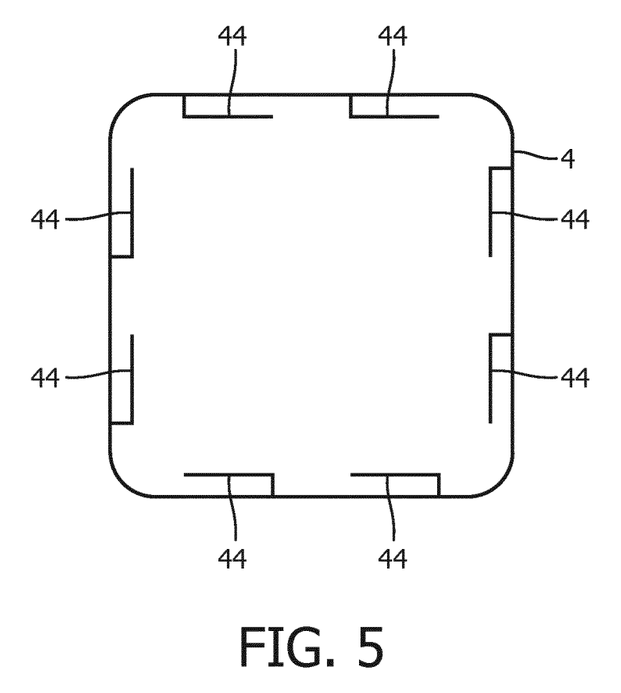

FIG. 4 schematically depicts RF coils 4 with integrated RF motion detector antennas according to further preferred embodiments of the invention, i.e. a) an antenna array 41, b) a dipole antenna 42, and c) a spiral Vivaldi design antenna 43. In FIG. 5, schematically an RF coil antenna 4 with integrated distributed stub antennas 44 according to another preferred embodiment of the invention is depicted.

Figure 6:
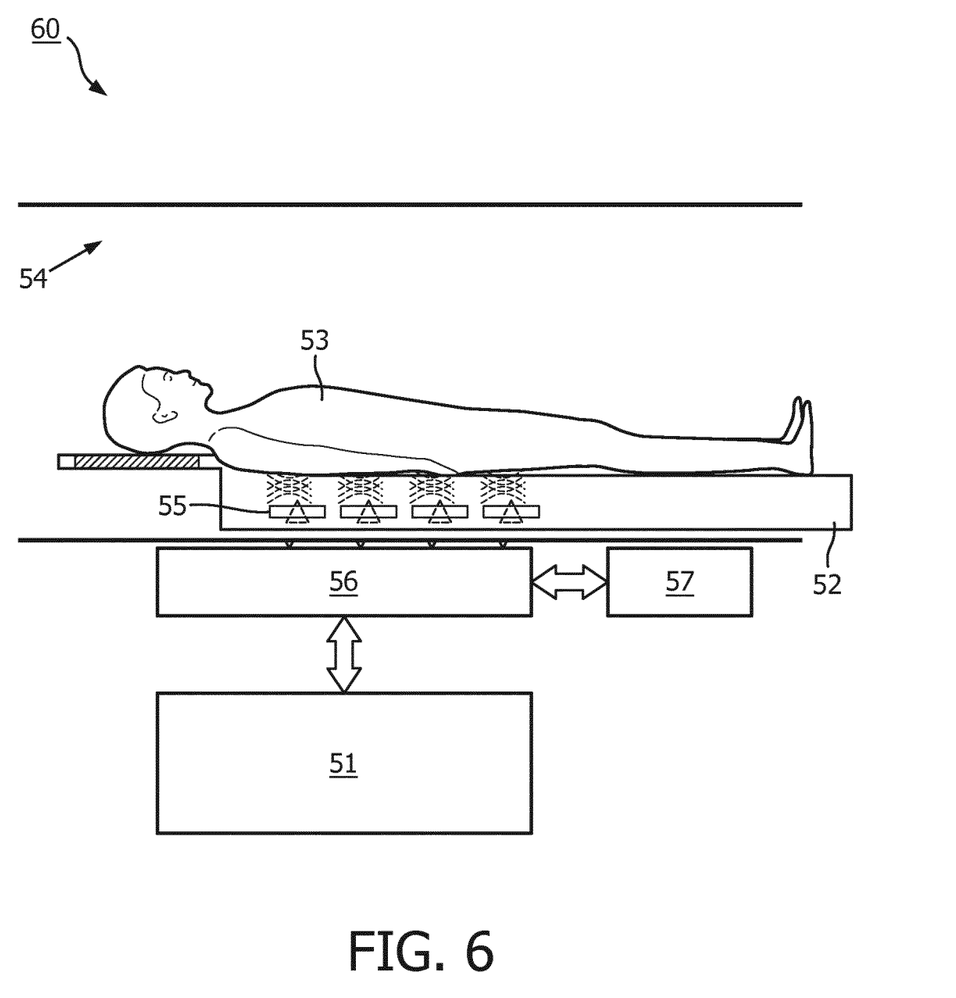

According to a preferred embodiment of the invention, the MRI system 60 schematically depicted in FIG. 6 comprises a machine-learning module 51 with deep learning capability. FIG. 6 further shows a patient bed 52 for holding a patient 53 during MRI examination in an MRI bore 54 of the MRI system 60. The patient bed 52 comprises several RF sensors 55 for transmitting RF transmit signals which are adapted for interacting with the tissue of the patient 53 allowing to sense motion signals due to motions of the patient 53 simultaneously to transmitting and/or receiving the RF signal for generating the magnetic resonance image. The RF sensors 55 are controlled by a signal control and processing unit 56 which is coupled both to a MRI console 57 for operation by a user and the machine-learning module 51. The machine-learning module 51 receives the sensed motion signals and the RF signals for generating the magnetic resonance image.

The machine-learning module 51 is identifying the relevant sensor attributes of the operating condition of the RF sensor 55, e.g.

Motion of heart
Motion of organs (respiration)
Motion of body and extremities
Posing of patient
Weight of patient
Electrical parameters (permittivity and loading)
Reflected power
Coil loading condition The signal control and processing unit 56 modifies the RF sensor coefficient setting continually and other parameters like the selection of sensors, frequency and antenna as the operating condition changes. The machine-learning module 51 monitors the present operating condition and, in response to abrupt changes, restores past coefficients that were successful under similar conditions beforehand.

Successful coefficient settings are stored in a list that is indexed using a multi-dimensional attribute vector derived from the measured operating condition. Unlike look-up-tables with array structures, the list generates elements automatically. The size of the list is dynamic, growing, as more operating conditions are experienced and contracting as neighbouring elements are recognized as redundant.

While the invention has been illustrated and described in detail in the drawings and foregoing description, such illustration and description are to be considered illustrative or exemplary and not restrictive; the invention is not limited to the disclosed embodiments. Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these mea-

REFERENCE SYMBOL LIST

Printed circuit board 1
Transceiver device 2
Antenna 3
RF coil 4
Additional RF sensor 5
Preamplifier 6
Digitizer and compressor 7
Digital interface 8
Digital modulator 9
Amplifier 10
Decorrelator 11
Coil 21
Motion-detecting device 22
Tissue 23
Antenna array 41
Dipole 42
Spiral Vivaldi design 43
Distributed stub antennas 44
Machine-learning module 51
Patient bed 52
Patient 53
MRI bore 54
RF sensors 55
Signal control and processing unit 56
MRI console 57
MRI system 60

The invention claimed is:

1. A magnetic resonance imaging system for examination of a patient, the magnetic resonance imaging system comprising:
  a radio frequency (RF) coil for transmitting and/or receiving an RF signal for generating a magnetic resonance image;
  a preamplifier connected with the RF coil; and
  an RF sensor for transmitting an RF transmit signal for interacting with tissue of the patient, and for receiving resulting motion signals due to motions of the patient simultaneously with the RF coil transmitting and/or receiving the RF signal for generating the magnetic resonance image,
  wherein the RF sensor is arranged together with the preamplifier, wherein the RF sensor comprises an antenna integrated into the RF coil, and wherein the RF transmit signal comprises a continuous-wave radar signal and/or an ultra wideband radar signal.

2. The magnetic resonance imaging system according to claim 1, wherein the preamplifier and the RF sensor form an integrated RF transceiver device for motion detection.

3. The magnetic resonance imaging system according to claim 2, wherein the integrated RF transceiver device is configured to generate a carrier signal which is a digital spread spectrum signal, and wherein the integrated RF transceiver device further comprises a decorrelator configured for removing spread spectrum signals from MRI signals such that the RF coil is simultaneously used for the MRI signals and additional RF signals for motion detection.

4. The magnetic resonance imaging system according to claim 1, wherein the RF sensor comprises an antenna located on a printed circuit board of the preamplifier.

5. The magnetic resonance imaging system according to claim 1, further comprising a machine-learning module with deep learning capability adapted for processing the received motion signals.

6. The magnetic resonance imaging system according to claim 5, wherein the machine-learning module is connected to the RF coil for receiving the RF signal for generating the magnetic resonance image.

7. The magnetic resonance imaging system according to claim 5, further comprising:
  an additional RF coil for transmitting and/or receiving an additional RF signal for generating a magnetic resonance image;
  an additional RF sensor for transmitting and receiving an additional RF transmit signal for interacting with the tissue of the patient, and for receiving resulting additional motion signals due to motions of the patient; and
  an additional machine-learning module for processing the additional motion signals, wherein the RF sensor and the additional RF sensor are separately connected to the machine-learning module and the additional machine-learning module, respectively, for processing the received motion signals and the received additional motion signals, respectively.

8. A method of operating a magnetic resonance imaging system for examination of a patient, the magnetic resonance imaging system comprising a radio frequency (RF) coil and an RF sensor, wherein the RF sensor comprises an antenna integrated into the RF coil, the method comprising:
  transmitting and/or receiving an RF signal for generating a magnetic resonance image by the RF coil using the RF coil;
  amplifying the RF signal using a preamplifier;
  transmitting an RF transmit signal for interacting with tissue of the patient using the RF sensor, wherein the RF sensor is arranged together with the preamplifier; and
  receiving motion signals which are due to motions of the patient, simultaneously with transmitting and/or receiving the RF signal for generating the magnetic resonance image, using the RF sensor,
  wherein the RF transmit signal comprises a continuous-wave radar signal and/or an ultra wideband radar signal.

9. The method of claim 8, further comprising:
  processing the received motion signals in a machine-learning module with deep learning capability.

10. The method of claim 9, further comprising:
  processing the received motion signals together with the RF signal for generating the magnetic resonance image in the machine-learning module.

11. A non-transitory computer-readable medium for controlling operation of a magnetic resonance imaging system for examination of a patient, the magnetic resonance imaging system comprising radio frequency (RF) coil and an RF sensor, wherein the RF sensor comprises an antenna integrated into the RF coil, the non-transitory computer-readable medium comprising instructions stored thereon, that when executed on a processor, cause the processor to:
  transmit and/or receive an RF signal for generating a magnetic resonance image by the RF coil using the RF coil;
  transmit an RF transmit signal for interacting with tissue of the patient using; the RF sensor, wherein the RF sensor is arranged together with a preamplifier; and
  receive motion signals which are due to motions of the patient, simultaneously with transmitting and/or receiving the RF signal for generating the magnetic resonance image, using the RF sensor,
wherein the RF transmit signal comprises a continuous-wave radar signal and/or an ultra wideband radar signal.

12. The magnetic resonance imaging system according to claim 2, wherein the RF coil is configured as an antenna device by the integrated RF transceiver device in a multi resonant design.

13. The method of claim 8, wherein the preamplifier and the RF sensor form an integrated RF transceiver device, the method further comprising:
generating a carrier signal, which is a digital spread spectrum signal, using the integrated RF transceiver device.

14. The method of claim 13, further comprising:
removing spread spectrum signals from MRI signals such that the RF coil is simultaneously used for the MRI signals and additional RF signals for motion detection.

\* \* \* \* \*